(12) United States Patent
Kim et al.

(10) Patent No.: US 11,935,840 B2
(45) Date of Patent: *Mar. 19, 2024

(54) SEMICONDUCTOR DEVICE WITH PARTIAL EMI SHIELDING REMOVAL USING LASER ABLATION

(71) Applicant: STATS ChipPAC Pte. Ltd., Singapore (SG)

(72) Inventors: ChangOh Kim, Incheon (KR); KyoWang Koo, Incheon (KR); SungWon Cho, Seoul (KR); BongWoo Choi, Seoul (KR); JiWon Lee, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/817,461

(22) Filed: Aug. 4, 2022

(65) Prior Publication Data

US 2022/0384360 A1 Dec. 1, 2022

Related U.S. Application Data

(63) Continuation of application No. 16/991,370, filed on Aug. 12, 2020, now Pat. No. 11,444,035, which is a (Continued)

(51) Int. Cl.
H01L 23/552 (2006.01)
H01L 21/56 (2006.01)
(Continued)

(52) U.S. Cl.
CPC ............ *H01L 23/552* (2013.01); *H01L 21/56* (2013.01); *H01L 23/28* (2013.01); *H01L 23/66* (2013.01);
(Continued)

(58) Field of Classification Search
CPC ....... H01L 23/552; H01L 21/56; H01L 23/28; H01L 23/66; H01L 24/94; H01L 25/50;
(Continued)

(56) References Cited

U.S. PATENT DOCUMENTS 6,744,126 B1 6/2004 Chiang
7,752,751 B2 7/2010 Kapusta et al.
(Continued)

FOREIGN PATENT DOCUMENTS

CN 204565427 U 8/2015
CN 105409060 A 3/2016
(Continued)

*Primary Examiner* — Caleen O Sullivan
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. A first component and second component are disposed over the substrate. The first component includes an antenna. A lid is disposed over the substrate between the first component and second component. An encapsulant is deposited over the substrate and lid. A conductive layer is formed over the encapsulant and in contact with the lid. A first portion of the conductive layer over the first component is removed using laser ablation.

23 Claims, 18 Drawing Sheets

Related U.S. Application Data continuation of application No. 16/234,156, filed on Dec. 27, 2018, now Pat. No. 10,784,210.

(51) Int. Cl.
    *H01L 21/60*     (2006.01)
    *H01L 23/00*     (2006.01)
    *H01L 23/28*     (2006.01)
    *H01L 23/66*     (2006.01)
    *H01L 25/00*     (2006.01)

(52) U.S. Cl.
    CPC .............. *H01L 24/94* (2013.01); *H01L 25/50* (2013.01); *H01L 2021/60112* (2013.01)

(58) Field of Classification Search
    CPC ......... H01L 2021/60112; H01L 21/561; H01L 23/3128; H01L 24/13; H01L 24/16; H01L 24/32; H01L 24/48; H01L 24/73; H01L 2223/6677; H01L 2224/0401; H01L 2224/04042; H01L 2224/131; H01L 2224/16235; H01L 2224/16245; H01L 2224/32245; H01L 2224/48091; H01L 2224/48247; H01L 2224/73265; H01L 2224/97; H01L 2924/15311; H01L 2924/3025; H01L 25/0655; H01L 23/31; H01L 23/5254; H01L 2924/014; H01L 2924/00014
    USPC ........................................................ 438/127
See application file for complete search history.

(56) References Cited

U.S. PATENT DOCUMENTS

| | | | |
|---|---|---|---|
| 7,968,979 B2 | 6/2011 | Pagaila et al. | |
| 8,199,518 B1 | 6/2012 | Chun et al. | |
| 8,593,727 B2 | 11/2013 | Kozlov | |
| 10,784,210 B2* | 9/2020 | Kim | H01L 23/552 |
| 11,088,082 B2 | 8/2021 | Kim et al. | |
| 11,444,035 B2* | 9/2022 | Kim | H01L 21/56 |
| 2010/0047970 A1 | 2/2010 | Eichelberger et al. | |
| 2012/0248585 A1 | 10/2012 | Wu | |
| 2012/0320558 A1 | 12/2012 | Foster et al. | |
| 2013/0037923 A1 | 2/2013 | Yoo | |
| 2016/0149300 A1 | 5/2016 | Ito et al. | |
| 2017/0077039 A1 | 3/2017 | Liao et al. | |
| 2017/0141045 A1 | 5/2017 | Kim et al. | |
| 2017/0194271 A1 | 7/2017 | Hsu et al. | |
| 2017/0301986 A1 | 10/2017 | Nguyen et al. | |
| 2018/0261551 A1 | 9/2018 | Lee et al. | |
| 2020/0075502 A1 | 3/2020 | Kim et al. | |

FOREIGN PATENT DOCUMENTS

| | | |
|---|---|---|
| CN | 106971989 A | 7/2017 |
| CN | 106972005 A | 7/2017 |
| JP | 2018026825 A | 2/2018 |
| KR | 20120008356 A | 1/2012 |
| KR | 20170057692 A | 5/2017 |
| KR | 20180104557 A | 9/2018 |
| KR | 20180128067 A | 11/2018 |

\* cited by examiner

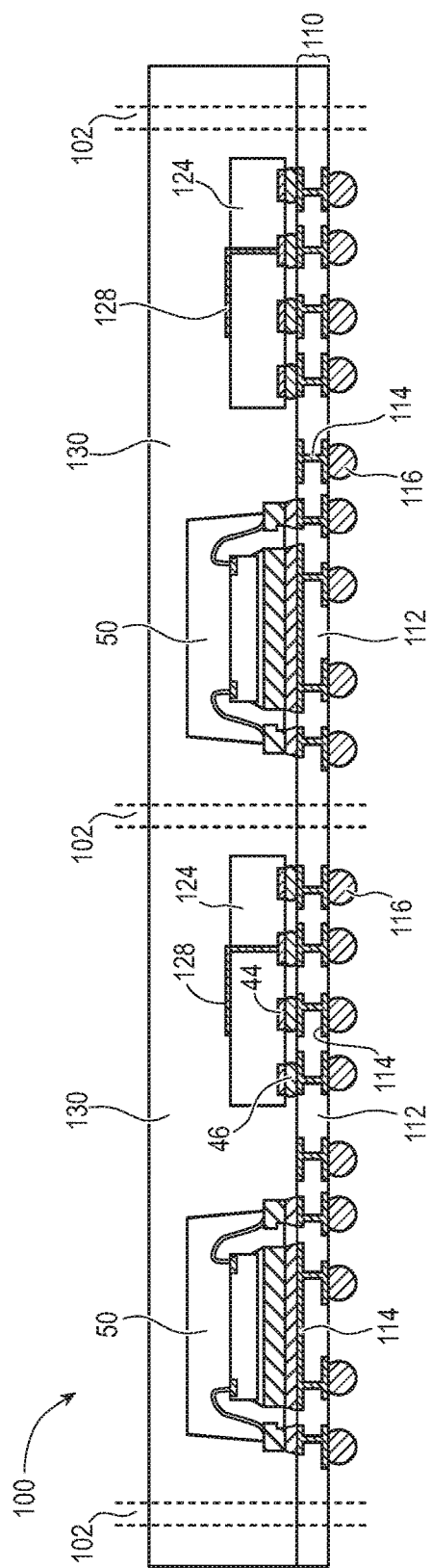
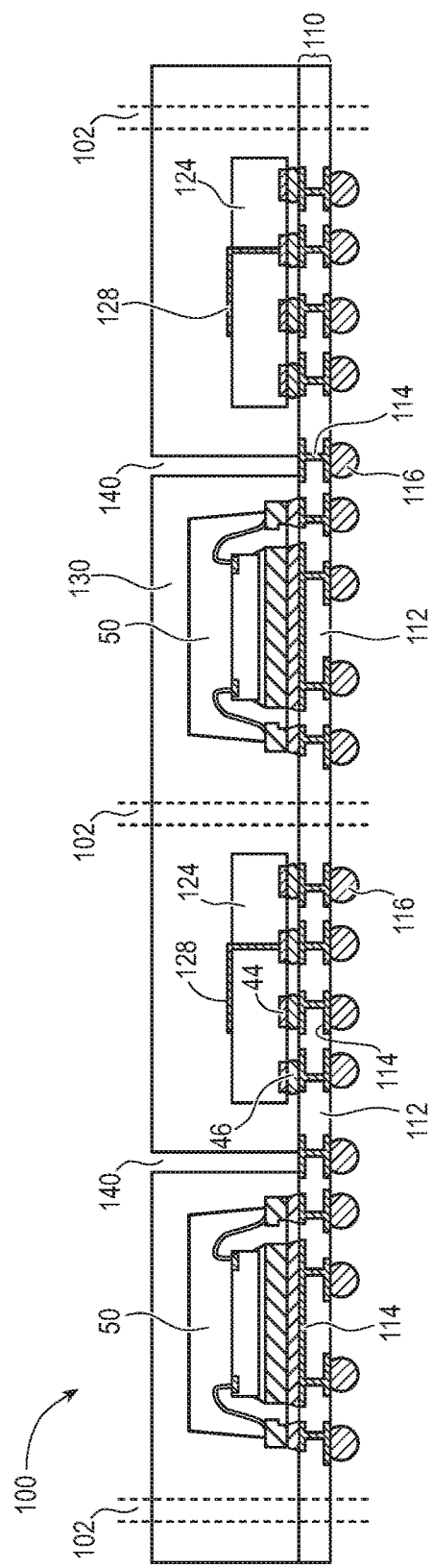
FIG. 2a
FIG. 2b

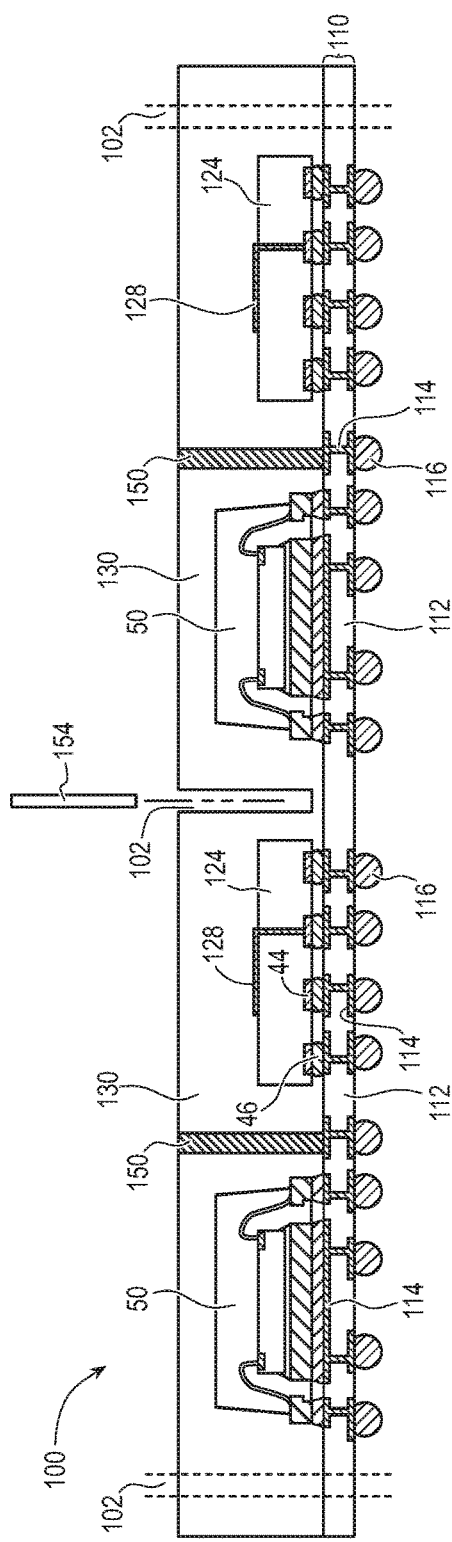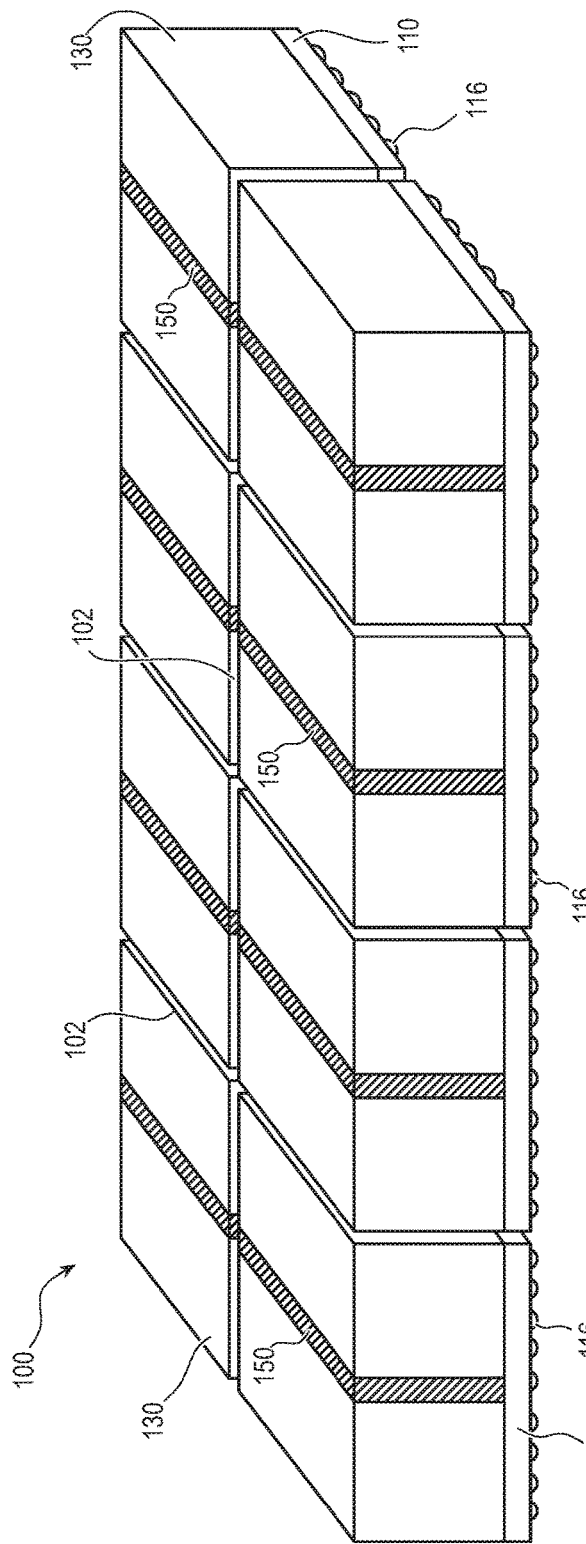

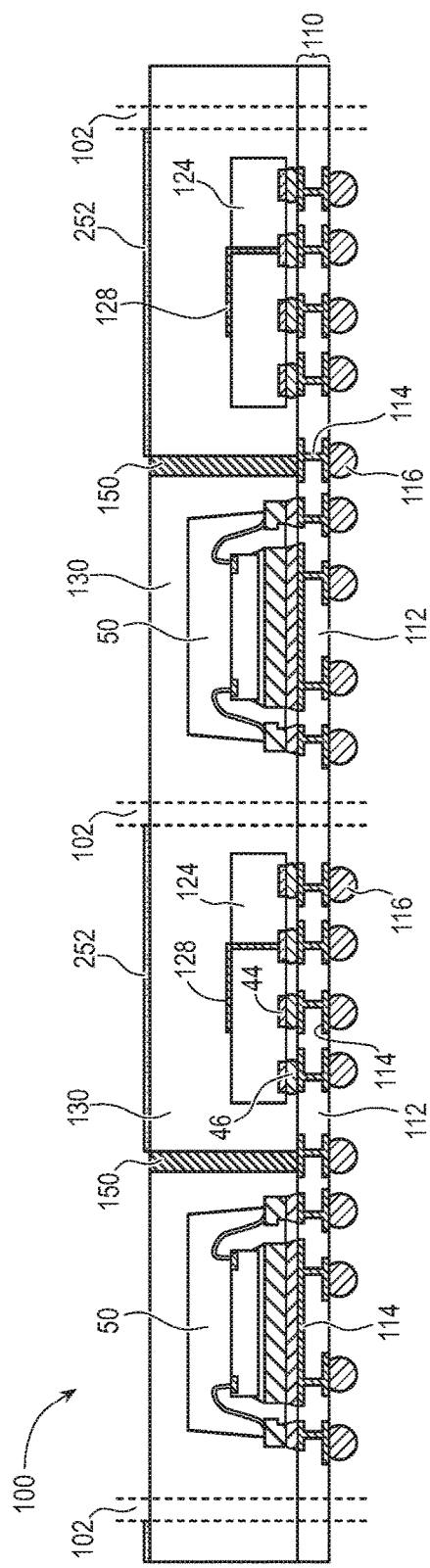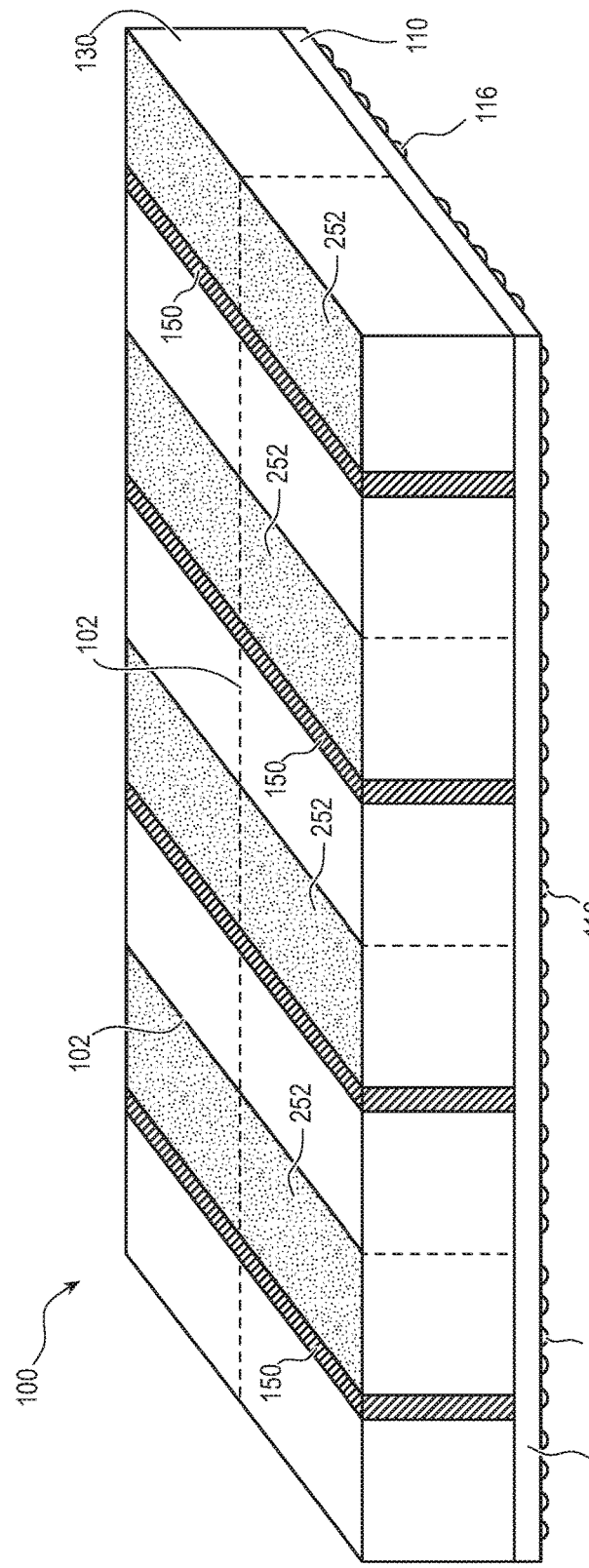

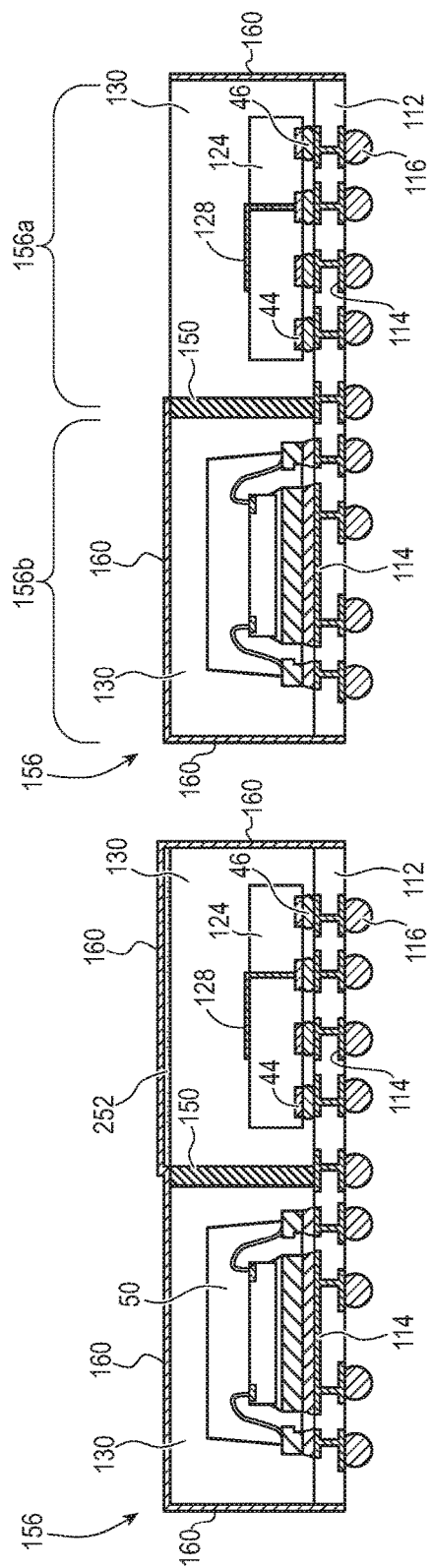
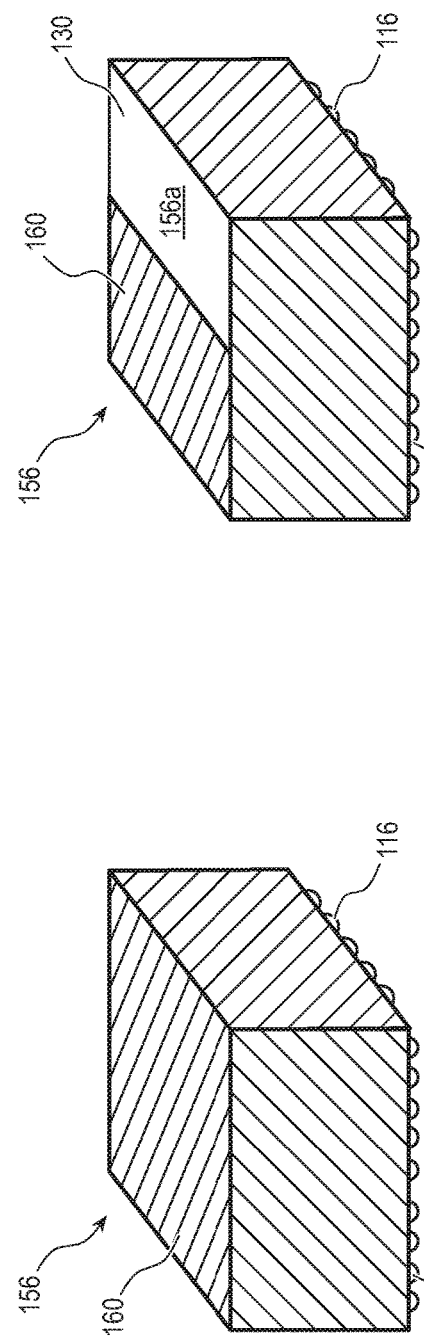
FIG. 8e
FIG. 8f
FIG. 8c
FIG. 8d

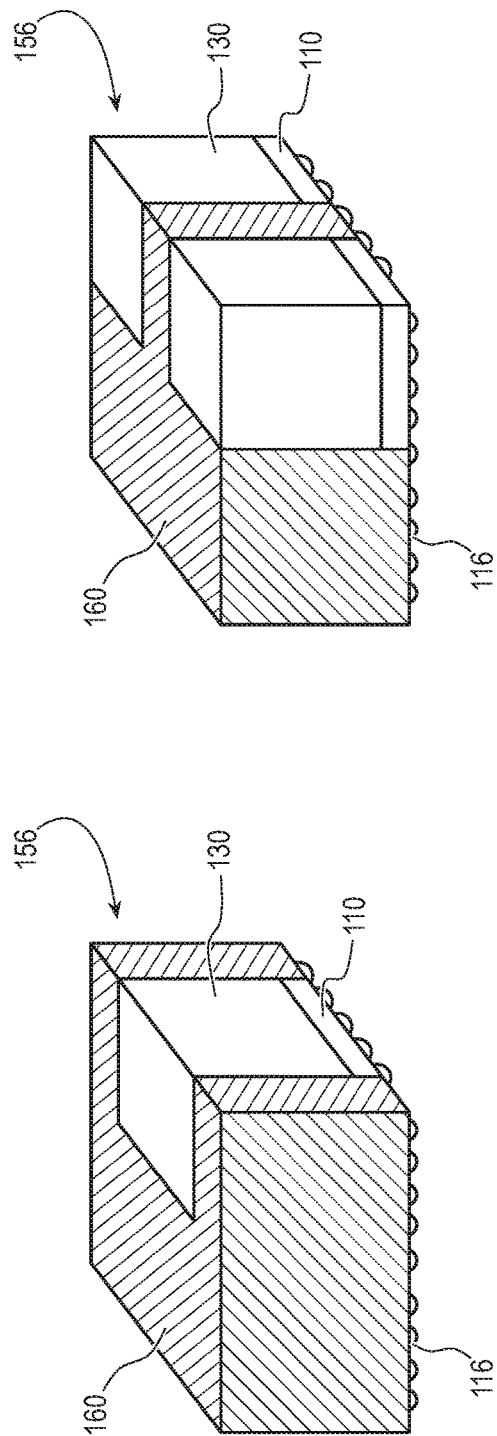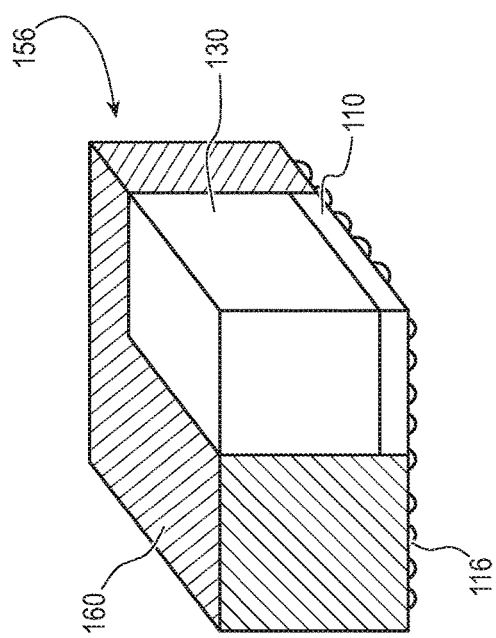
FIG. 9a
FIG. 9b
FIG. 9c

SEMICONDUCTOR DEVICE WITH PARTIAL EMI SHIELDING REMOVAL USING LASER ABLATION

CLAIM TO DOMESTIC PRIORITY

The present application is a continuation of U.S. patent application Ser. No. 16/991,370, now U.S. Pat. No. 11,444, 035, filed Aug. 12, 2020, which is a continuation of U.S. patent application Ser. No. 16/234,156, now U.S. Pat. No. 10,784,210, filed Dec. 27, 2018, which applications are incorporated herein by reference.

FIELD OF THE INVENTION

The present invention relates in general to semiconductor devices and, more particularly, to semiconductor devices, and methods of forming semiconductor devices, with electromagnetic interference (EMI) shielding layers that are partially removed using laser ablation.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices commonly include some circuitry to process radio frequency (RF) signals. Recent technological advances allow for high speed digital and RF semiconductor packages integrated with small sizes, low heights, high clock frequencies, and good portability using system-in-package (SiP) technology. SiP devices include multiple semiconductor components, e.g., semiconductor die, semiconductor packages, integrated passive devices, and discrete active or passive electrical components, integrated together in a single semiconductor package.

FIG. 1 illustrates a prior art SiP device 30. SiP device 30 includes a plurality of components disposed on a PCB or other substrate 32. Substrate 32 includes one or more insulating layers 34 with conductive layers 36 formed over, between, and through insulating layers 34.

Semiconductor die 40 is integrated as part of SiP device 30. Semiconductor die 40 includes an active surface 42 with contact pads 44 formed over the active surface. Solder bumps 46 are used to electrically and mechanically couple contact pads 44 of semiconductor die 40 to conductive layer 36 of substrate 32. Semiconductor die 40 is electrically coupled to semiconductor package 50 through conductive layers 36.

Semiconductor package 50 includes semiconductor die 52 to provide active functionality. Semiconductor die 52 has contact pads 54 over an active surface of the semiconductor die. Semiconductor die 52 is disposed over a die pad of leadframe 56 and coupled to contacts or leads of the leadframe by bond wires 57. Semiconductor die 52, bond wires 57, and leadframe 56 are molded in encapsulant 58 prior to integration into SiP device 30. Once completed, semiconductor package 50 is mounted on substrate 32 with solder 59 used for mechanical and electrical coupling. In one embodiment, solder 59 is a solder paste printed onto substrate 32 prior to mounting of semiconductor package 50.

A second encapsulant 60 is deposited over semiconductor die 40, semiconductor package 50, and substrate 32 after integration to environmentally protect SiP device 30. Solder bumps 62 are disposed on the opposite side of substrate 32 from semiconductor die 40 and semiconductor package 50. Bumps 62 are subsequently used to mount SiP device 30 onto the substrate of a larger electronic device. SiP device 30 includes a plurality of semiconductor devices that operate together to achieve a desired electrical functionality.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Because of the high speed digital and RF circuits in SiP device 30, shielding from electromagnetic interference (EMI) is important. Conformal EMI shielding has emerged as a preferred method to reduce the effects of EMI. EMI from nearby devices hitting SiP device 30 can cause malfunctions within the SiP device's components. EMI from SiP device 30 may also cause malfunctions in nearby devices. FIG. 1 illustrates a conformal EMI shield 64. EMI shield 64 is a thin layer of metal formed by sputtering that is conformally coated over the top and side surfaces of SiP device 30 after encapsulant 60 is deposited. EMI shield 64 reduces the magnitude of EMI radiation entering and exiting SiP device 30 to reduce interference. In some embodiments, EMI shield 64 is coupled to ground through conductive layers 36 in substrate 32 that extend to the edge of the substrate.

EMI shield 64 provides a reduction in EMI interference. However, conformal coating EMI shield 64 over the entirety of SiP device 30 causes problems for devices or modules in the SiP device that need to act as a transceiver antenna. EMI shield 64 reduces the magnitude of all electromagnetic radiation, including radiation desired for communication or other purposes. To transmit and receive using an antenna, semiconductor die 40 or semiconductor package 50 must be coupled to a separate element of the electronic device with an antenna outside of EMI shield 64. However, having transceiver components integrated within a SiP device along with other components that benefit from EMI protection would allow further improvements in speed, size, and power requirements of electronic devices. Therefore, a need exists for partial EMI shielding of semiconductor packages.

BRIEF DESCRIPTION OF THE DRAWINGS

FIGS. 2a-2h illustrate a process of forming a SiP device with EMI shielding;

FIGS. 8a-8f illustrate a process of partially removing EMI shielding using a combination of a film mask and laser removal;

FIGS. 9a-9c illustrate alternative configurations for the removal of EMI shielding.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1:
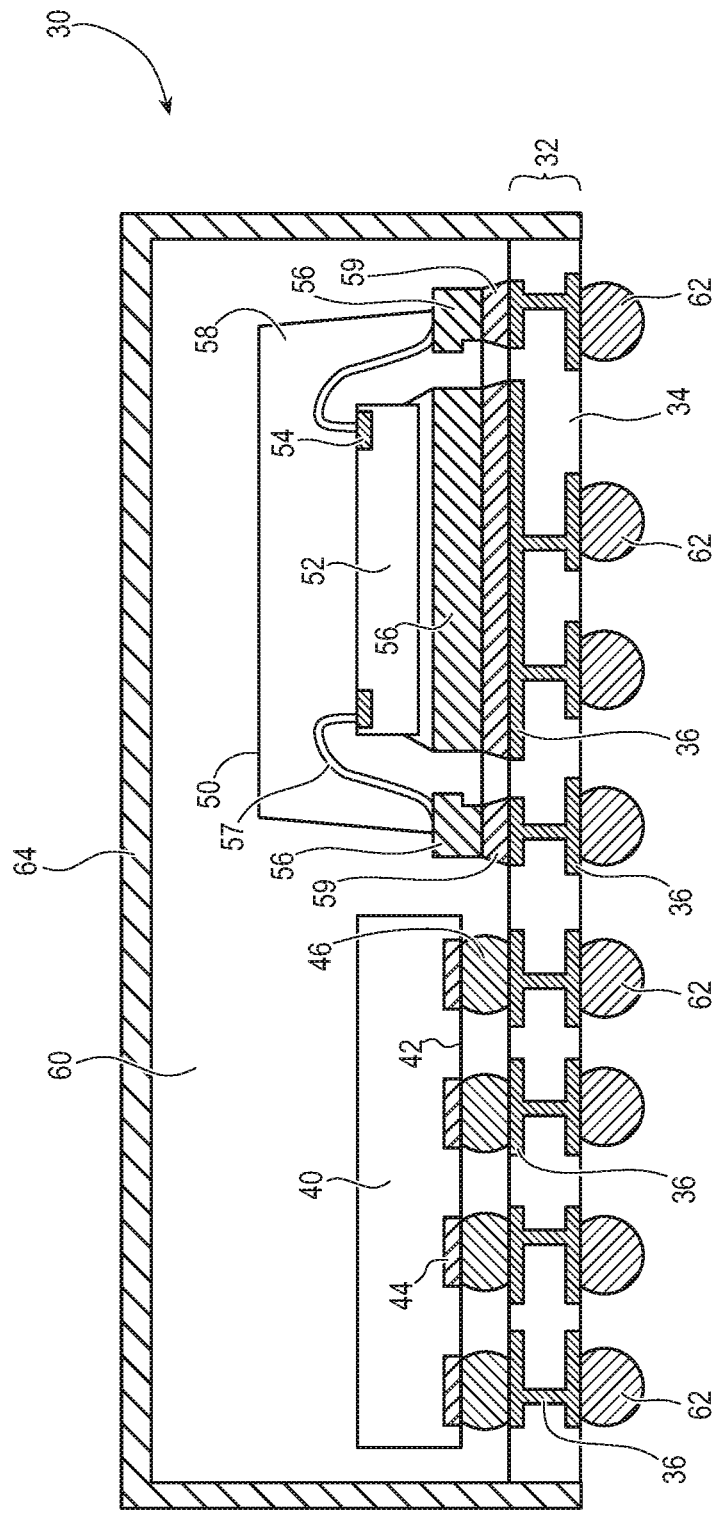
FIG. 1 illustrates a SiP device with a conformally applied electromagnetic interference (EMI) shielding layer.

FIG. 2a is a cross-sectional view of a panel 100 of SiP devices separated by saw streets 102 prior to forming of a partial EMI shield and singulation into individual SiP devices. Two SiP devices are illustrated, but hundreds or thousands of SiP device are commonly formed in a single panel using the same steps illustrated below. Panel 100 is formed over a substrate 110, similar to substrate 32 in FIG. 1. Substrate 110 includes one or more insulating layers 112 interleaved with one or more conductive layers 114. Insulating layer 112 is a core insulating board in one embodiment, with conductive layers 114 patterned over the top and bottom surfaces, e.g., a copper-clad laminate substrate. Conductive layers 114 also include conductive vias electrically coupled through insulating layers 112. Substrate 110 can include any number of conductive and insulating layers interleaved over each other. A solder mask or passivation layer can be formed over either side of substrate 110.

Solder bumps 116 are formed on contact pads of conductive layer 114 over the bottom surface of substrate 110. Bumps 116 are optionally formed at a later processing step. Other types of interconnect structures are used in other embodiments for integration of the SiP devices into an electronic device, such as stud bumps, conductive pins, copper pillars, land grid array (LGA) pads, or wire bonds.

Any suitable type of substrate or leadframe is used for substrate 110 in other embodiments. In one embodiment, panel 100 is formed over a sacrificial substrate 110 that is later removed. Removing the sacrificial substrate exposes interconnect structures on the encapsulated devices, e.g., bumps 46 on semiconductor die 124, for subsequent integration into the larger system.

Any components desired to implement the intended functionality of the SiP devices are mounted to or disposed over substrate 110 and electrically connected to conductive layers 114. FIG. 2a illustrates semiconductor package 50 and semiconductor die 124 mounted on substrate 110 as an example. Semiconductor die 124 is a transceiver device that uses antenna 128 to convert between an electromagnetic radiation signal sent or received over the airwaves and an electrical signal within the semiconductor die. The transceiver functionality of semiconductor die 124 will be facilitated by not having a conformal EMI shielding layer formed over antenna 128, which could block desirable signals. On the other hand, semiconductor package 50 is an example device that will benefit from EMI shielding.

In one embodiment, semiconductor die 124 is a radar device used for object detection in self-driving vehicles, and semiconductor package 50 includes memory and logic circuits to support the radar functionality. In other embodiments, any desired components can be incorporated into a SiP device. The components can include any combination of any type of semiconductor package, semiconductor die, integrated passive device, discrete active or passive components, or other electrical components.

The components in each SiP device, e.g., semiconductor die 124 and semiconductor package 50, are mounted on and connected to substrate 110 by a suitable interconnect structure, e.g., solder bumps 46, and then encapsulated. An encapsulant or molding compound 130 is deposited over semiconductor die 124, semiconductor package 50, and substrate 110 using a paste printing, compressive molding, transfer molding, liquid encapsulant molding, vacuum lamination, spin coating, or another suitable applicator. Encapsulant 130 can be polymer composite material, such as epoxy resin, epoxy acrylate, or any suitable polymer with or without filler. Encapsulant 130 is non-conductive, provides structural support, and environmentally protects the SiP devices from external elements and contaminants.

In FIG. 2b, a trench 140 is formed through each SiP device between semiconductor die 124 and semiconductor package 50. Trench 140 is formed by chemical etching with a photolithographic mask, laser ablation, saw cutting, reactive ion etching, or another suitable trenching process. In one embodiment, trench 140 extends continuously for an entire length of panel 100 into and out of the page of FIG. 2b. Trench 140 is shorter in other embodiments, e.g., only formed directly between semiconductor die 124 and semiconductor package 50 and not extending to the edges of the SiP devices. Trench 140 is formed completely through encapsulant 130 down to substrate 110. In some embodiments, a portion of conductive layer 114 is exposed within trench 140. Conductive layer 114 can be patterned to include a strip extending for the length of trench 140 to reduce electrical resistance between the conductive layer and conductive material subsequently deposited into the trench.

Figure 2C:
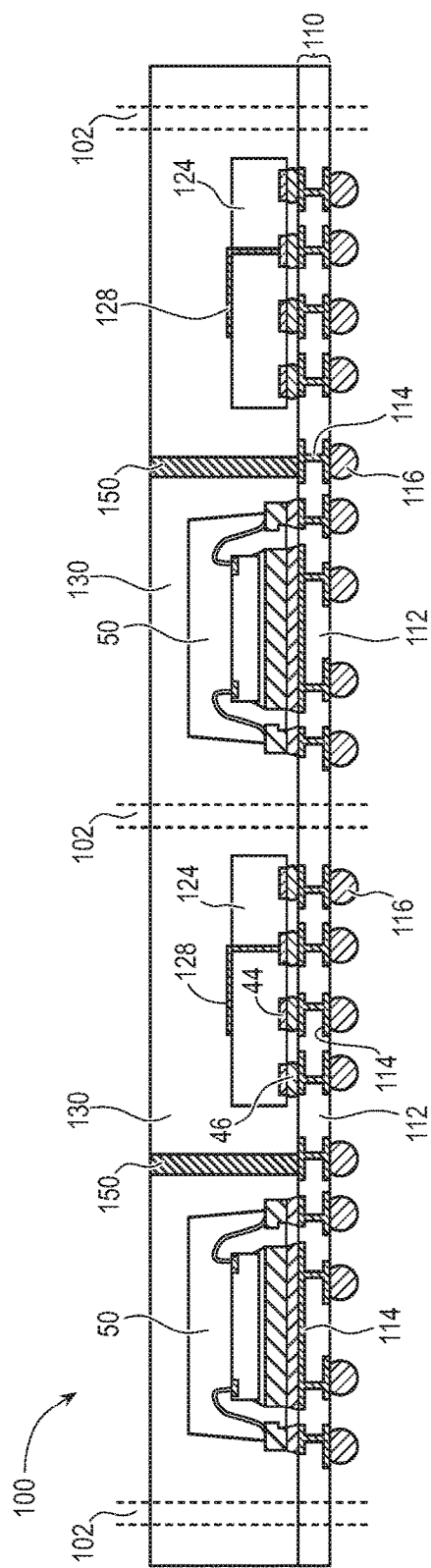

FIG. 2c illustrates a partial cross-section of panel 100. Trenches 140 are filled with conductive material to form lids 150. Lid 150 is formed using any suitable metal deposition technique. Lid 150 can be formed by filling trench 140 with a conductive ink or paste, or plating conductive material within the trench. In other embodiments, lid 150 is preformed and inserted into trench 140. Lid 150 is a metal layer extending between semiconductor die 124 and package 50 to reduce the magnitude of EMI directly radiating from antenna 128 toward package 50, or vice versa. In some embodiments, lid 150 is electrically coupled to a ground node through conductive layer 114 and bumps 116 to aid in EMI blocking capability. In other embodiments, lid 150 reduces EMI without a connection to conductive layer 114 or a ground node.

Figure 2D:
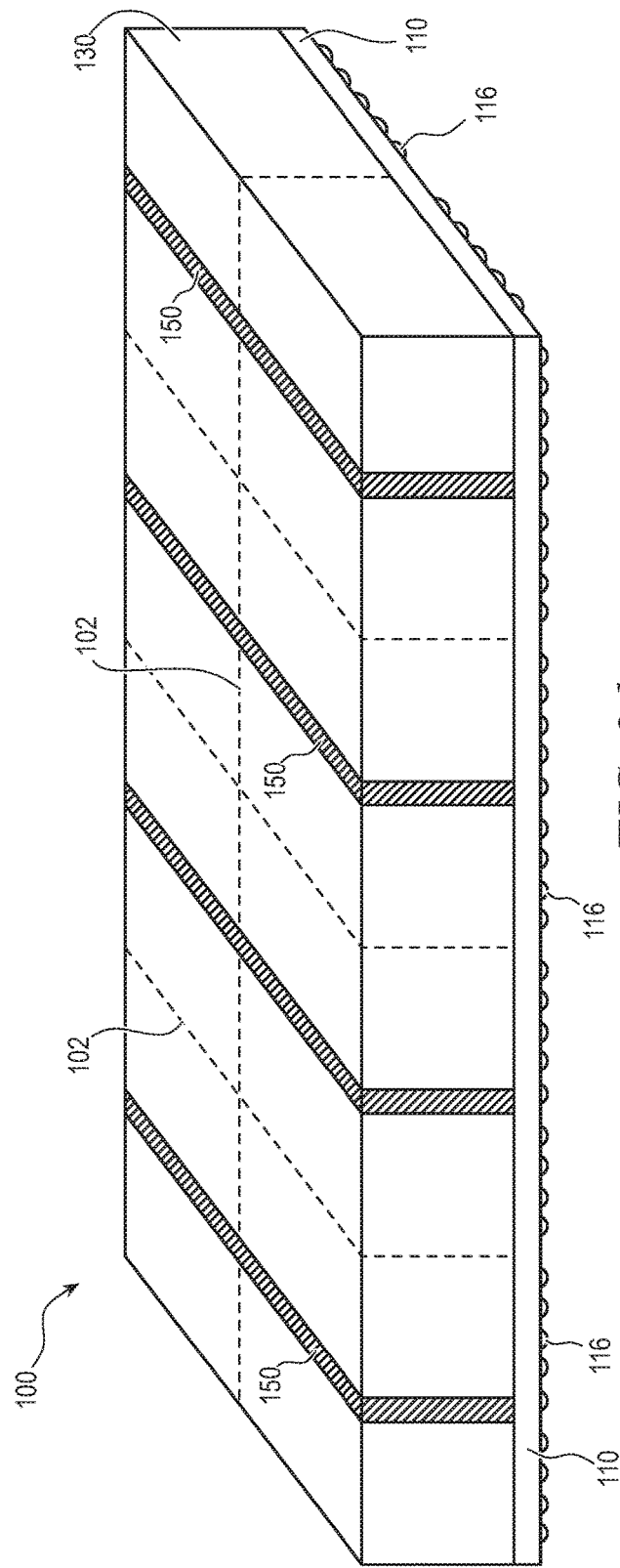

FIG. 2d illustrates a perspective view of a portion of panel 100 having eight SiP devices formed at once. Each of the eight SiP devices includes a lid 150 splitting the device into two distinct regions. Lid 150 is illustrated as being halfway between adjacent saw streets 102. However, the lid can form any desired size and shape of partition for EMI shielding. Each column or row of devices shares a lid 150 in common, as trench 140 and lid 150 are formed for an entire length or width of panel 100. In other embodiments, each device has a separate lid 150 that may or may not extend to saw streets 102.

Figure 2G:
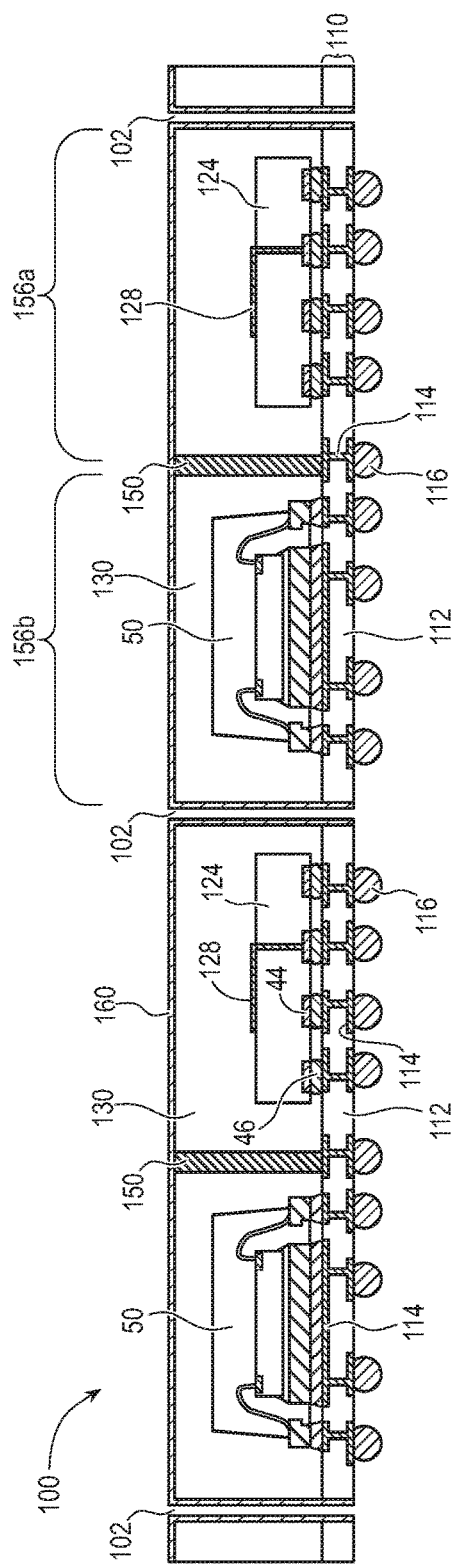

In FIG. 2e, panel 100 is singulated at saw streets 102 using a saw blade, water jet, or laser cutting tool 154 to cut through encapsulant 130 and substrate 110 and separate each of the devices into an individual SiP device 156 as shown in FIG. 2f. Singulation creates a gap between each unit where saw streets 102 were located. The gap allows deposition of a conformal shielding layer over side surfaces of SiP devices 156 in FIGS. 2g and 2h, which show two different views of the same processing step.

Conformal shielding layer 160 is formed over SiP devices 156 and completely covers top and side surfaces of each SiP device. Shielding layer 160 is formed by spray coating, plating, sputtering, or any other suitable metal deposition process. Shielding layer 160 can be formed from copper, aluminum, iron, or any other suitable material for EMI shielding. In some embodiments, panel 100 is disposed on a carrier with an optional thermal release or interface layer during singulation in FIG. 2e. The singulated SiP devices 156 remain on the same carrier for application of shielding layer 160. Therefore, the space between adjacent SiP devices 156 during forming of shielding layer 160 is equivalent to the width of the saw kerf of cutting tool 154. The thickness of shielding layer 160 is low enough that the shielding layers of adjacent SiP devices 156 do not touch and the packages remain singulated on the carrier. In other embodiments, SiP devices 156 are disposed on a separate carrier after singulation and prior to forming shielding layer 160.

Shielding layer 160 completely covers every exposed surface of SiP device 156, including the top and all four side surfaces. All exposed surfaces of encapsulant 130 are coated in the conductive material in forming shielding layer 160. The bottom surface of SiP device 156 with substrate 110 and bumps 116 is normally not covered by shielding layer 160, either because the sputtering method is from the top-down and only covers sideways or upward facing surfaces, or because an interface layer on the carrier fully covers the bottom surface and operates as a mask.

Shielding layer 160 is formed directly contacting top and side surfaces of lid 150 to form a continuous EMI shield. Each SiP device 156 is split into two sides by lid 150: open side 156a and shielded side 156b. Open side 156a is referred to as the open side because the open side will have shielding layer 160 at least partially removed so that components are "open" to send and receive radio signals. Any devices that desirably emit or receive electromagnetic radiation, e.g., semiconductor die 124, are placed within open side 156a. Any devices that are to be protected from EMI by shielding, e.g., semiconductor package 50, are placed within shielded side 156b. The devices on open side 156a and shielded side 156b can be electrically coupled to each other across the boundary created by lid 150 through conductive layers 114, or by an underlying substrate of a larger electronic device that SiP device 156 is integrated into.

FIGS. 3a-3d illustrate a method of removing shielding layer 160 using a single laser 180 directed from above the units. In one embodiment, laser 180 is part of an assembly with scanner 182. Laser 180 and scanner 182 are computer controlled and able to move in a plane parallel to the carrier that SiP devices 156 are placed on. The controller moves scanner 182 above a particular SiP device 156, and then, in FIGS. 3a and 3b, operates the laser assembly to remove shielding layer 160 on the top surface of open side 156a. In other embodiments, laser 180 and scanner 182 remain static, and the carrier holding SiP devices 156 is moved under the laser assembly to advance the ablation process to a different SiP device.

Scanner 182 receives a light beam from laser 180 and guides the beam down to a SiP device 156. Scanner 182 moves the laser beam around to evenly hit all areas of shielding layer 160 to be removed. Scanner 182 can move the beam from laser 180 in any suitable scanning pattern to remove shielding layer 160 from the desired surface area, e.g., an "S" scanning pattern or a fractal scanning pattern.

A two-step removal process is used for shielding layer 160 on the top surface of open side 156a. First, shielding layer 160 is removed using a metal peeling process, whereby the beam from laser 180 is defocused and the energy peels off the desired portion of shielding layer 160. Metal peeling is a type of laser ablation. After the peeling process removes shielding layer 160 where desired, soft laser ablation is performed with laser 180 set at a low power level as a cleaning process to remove remaining metal residue. In other embodiments, a single-step laser ablation process is performed on the top surface with laser 180.

Figure 3A:
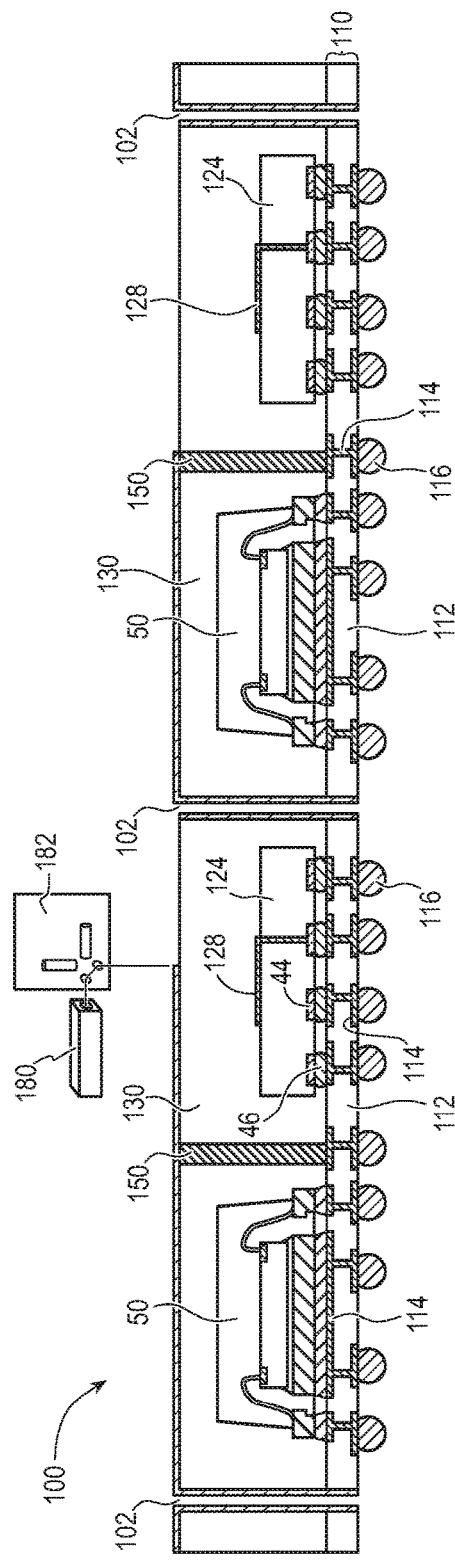
FIGS. 3a-3d illustrate a process of partially removing the EMI shielding from a plurality of SiP devices on a carrier using a single laser.
Figure 3B:
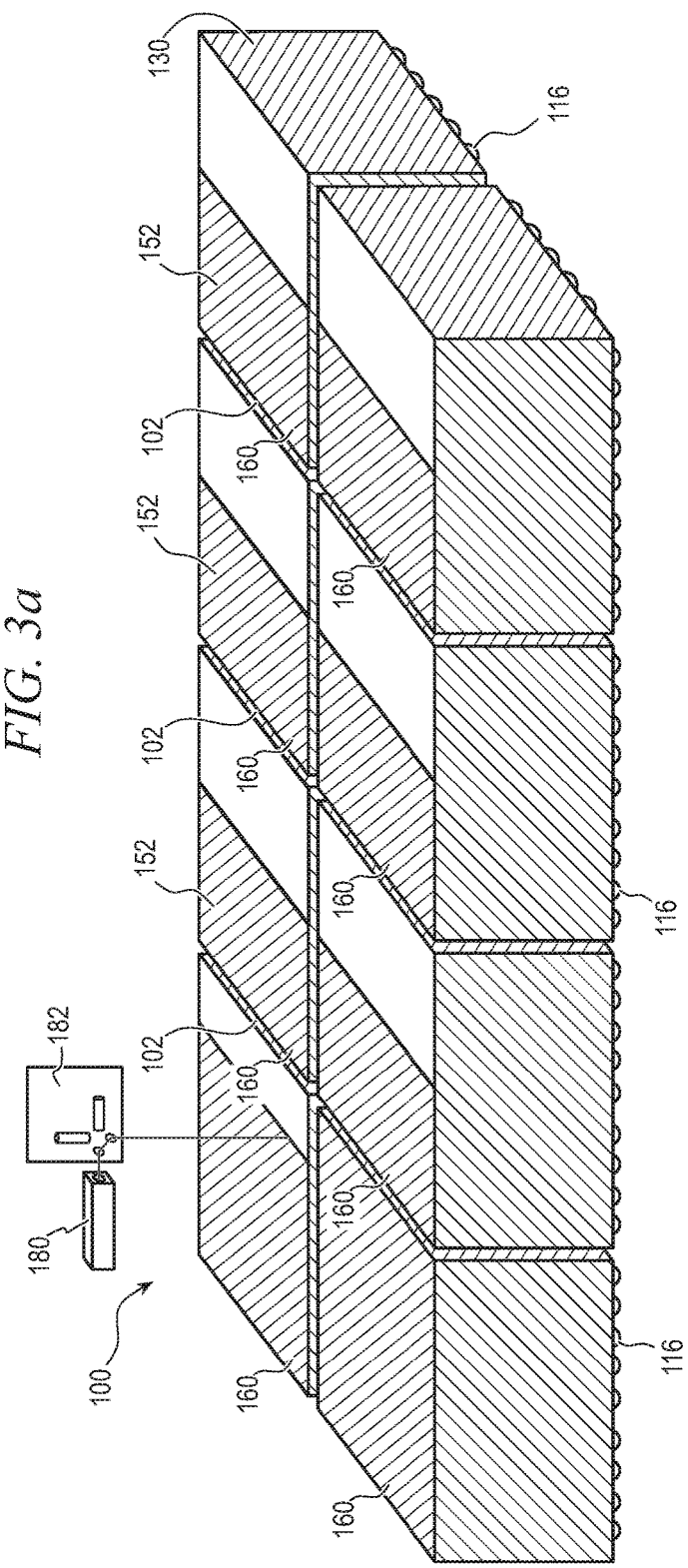

Only the top surface of SiP devices 156, opposite substrate 110, have shielding layer removed in FIGS. 3a and 3b. Shielding layer 160 is only partially removed to remain in electrical and physical contact with the top of lid 150, thus maintaining a continuous shield around the sides and over the top of shielded side 156b. In some embodiments, SiP devices 156 are completed after processing is complete in FIGS. 3a and 3b. Opening only the top of open side 156a is sufficient for the desired use of SiP devices 156 in some embodiments.

Figure 3C:
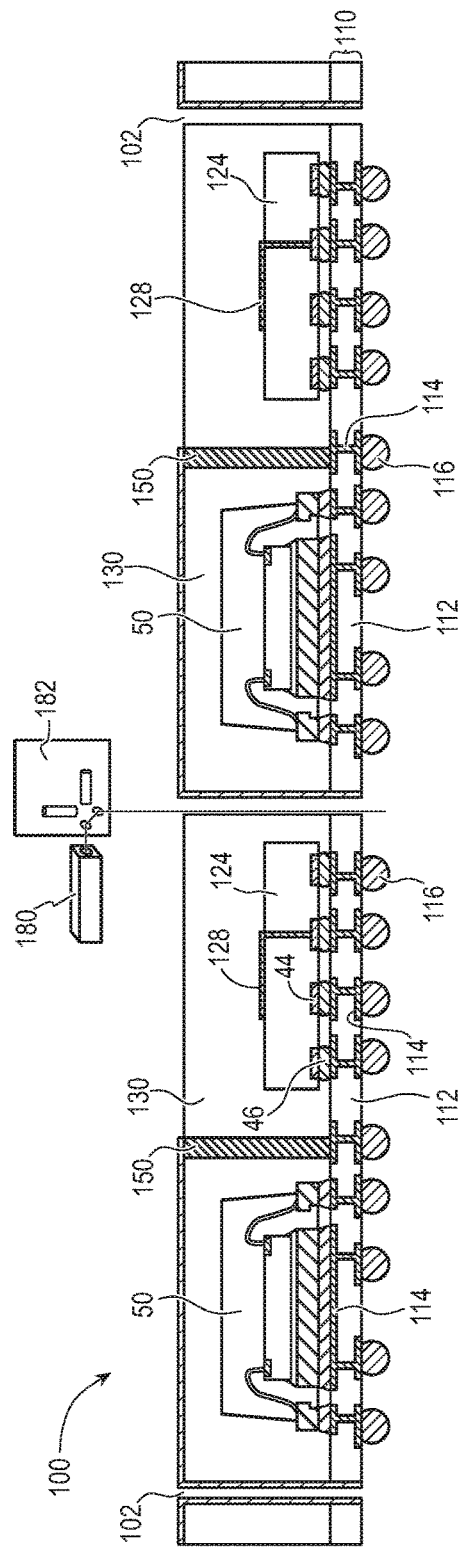
Figure 3D:
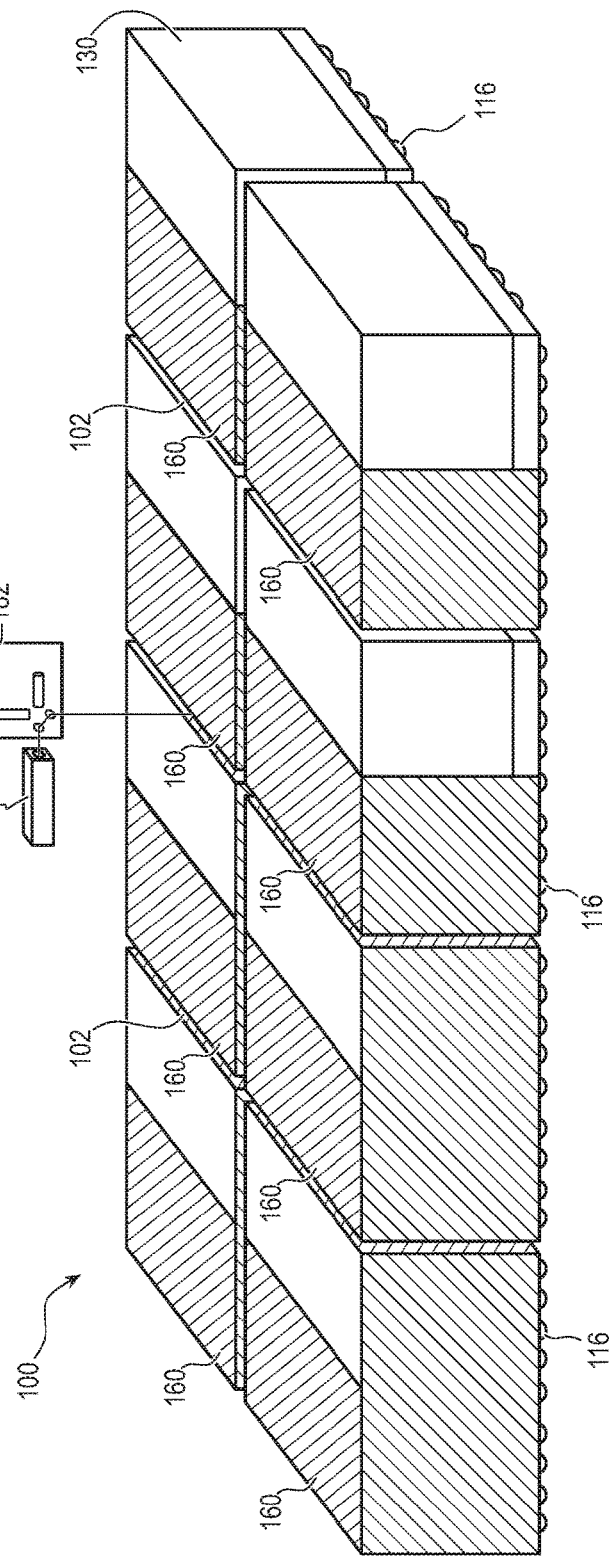

FIGS. 3c and 3d show further processing to remove shielding layer 160 over side surfaces of open side 156a. The assembly of laser 180 and scanner 182 is again moved from unit to unit to perform laser ablation on the side surfaces of SiP devices 156. In another embodiment, different lasers are used for ablation of the top and side surfaces. The processing of both top and side surfaces can be performed on each individual SiP device 156 before moving on to another device, or the top surfaces of all SiP devices 156 can be processed prior to any of the side surfaces.

Scanner 182 is positioned in the plane of a side surface of an open side 156a and used to direct a beam from laser 180 down the height of the side surface. The beam of laser 180 ablates shielding layer 160 for the entire height of SiP device 156 where the beam is directed. The beam of laser 180 is swept across the side surface by scanner 182 to fully remove shielding layer 160 from the side surface. In some embodiments, a portion of encapsulant 130 and substrate 110 are removed along with shielding layer 160.

Once all desired portions of shielding layer 160 are removed from side surfaces of a SiP device 156, scanner 182 is moved to the next SiP device to be processed. In some embodiments, scanner 182 is repositioned for each individual side surface of a SiP device 156. To fully remove shielding layer 160 from over open side 156a, the beam of laser 180 is guided in the shape of a bracket character, i.e., ], cutting vertically through the edge of SiP device 156. Shielding layer 160 remains physically contacting the sides of lid 150 to maintain continuous shielding all the way around closed side 156b.

Figure 4B:
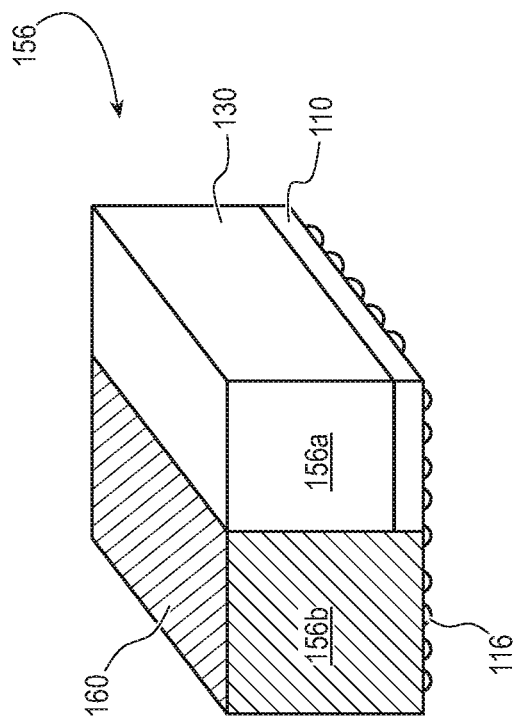
FIGS. 4a and 4b illustrate the SiP device formed with partial shielding.
Figure 4A:
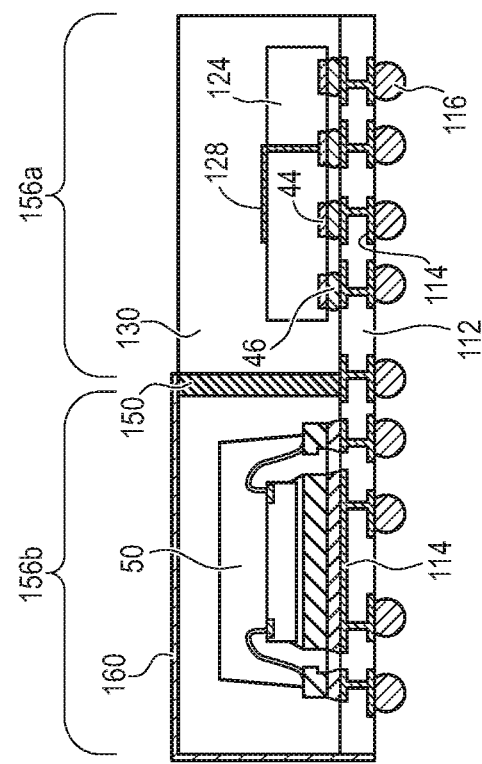

FIGS. 4a and 4b show a SiP device 156 after shielding layer 160 is removed from top and side surfaces of open side 156a. Package 50 is fully EMI shielded by shielding layer 160 on the top and three sides and lid 150 on the fourth side. Shielding layer 160 contacts lid 150 for an entire height and width of the lid. Semiconductor die 124 has shielding layer 160 cleared on side and top surfaces of SiP module 156, and is therefore able to send and receive radio signals while package 50 is fully protected.

Figure 5A:
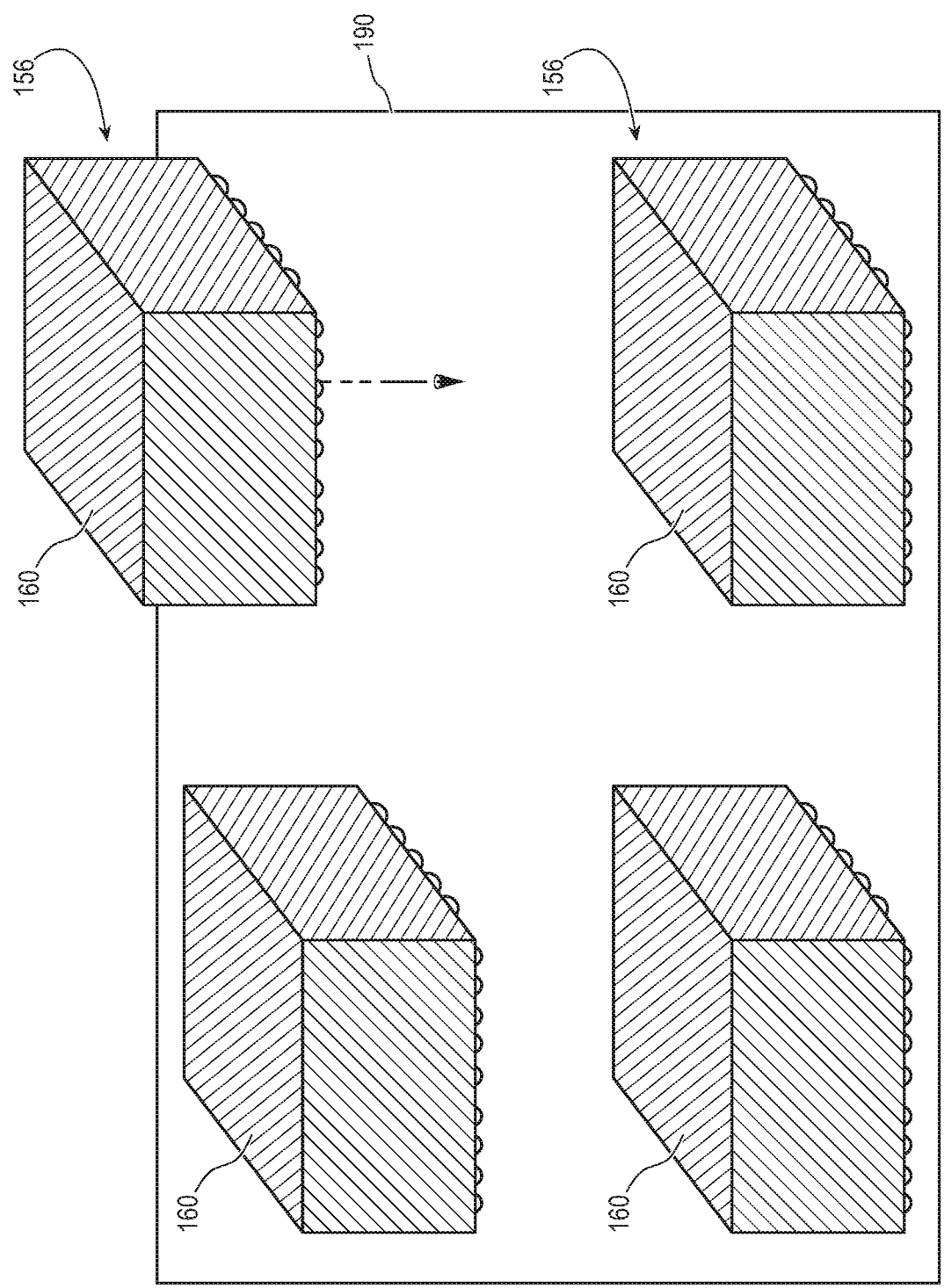
FIGS. 5a and 5b illustrate a process of partially removing EMI shielding from a plurality of units using a multi-laser setup.
Figure 5B:
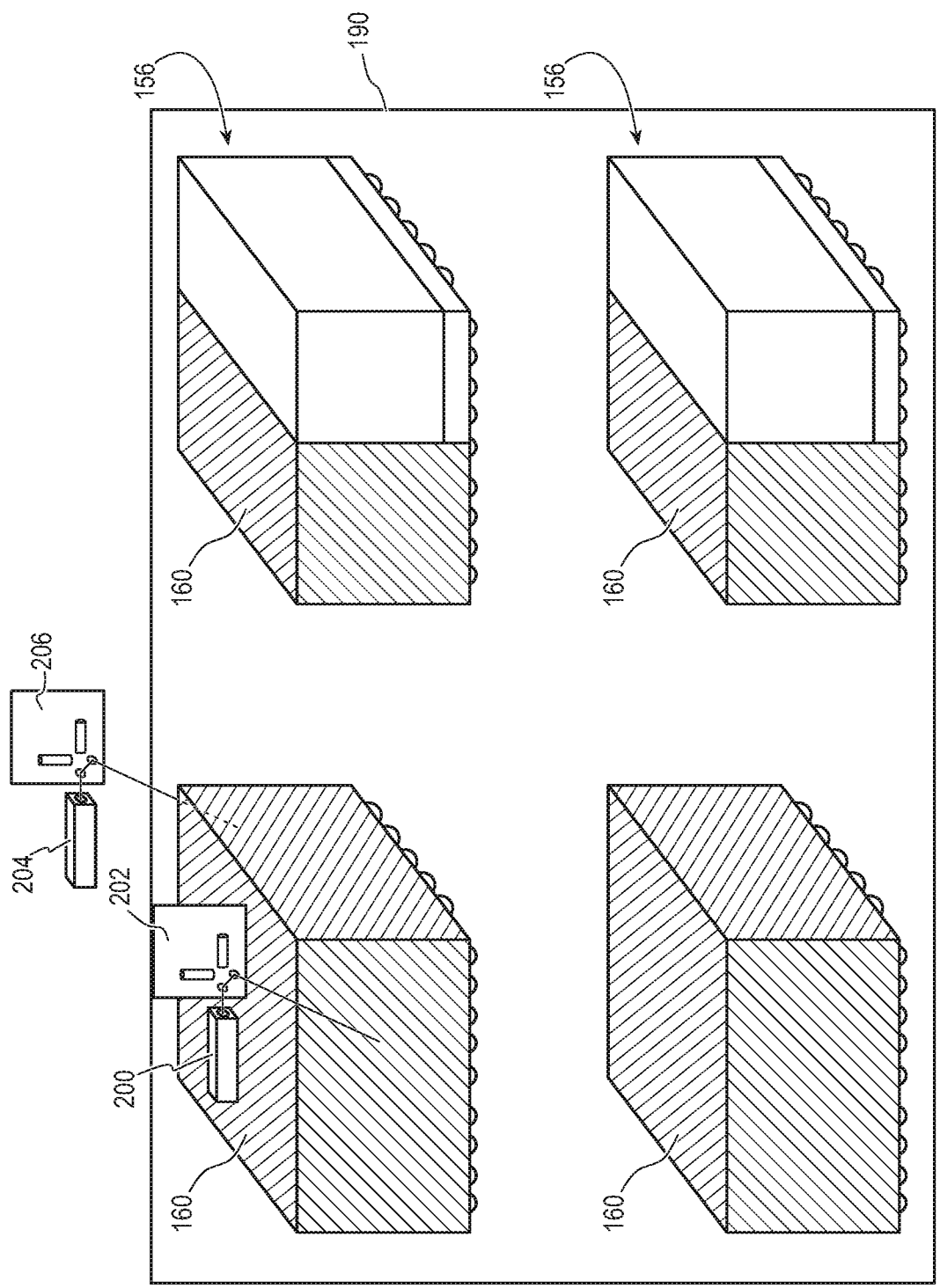

FIGS. 5a and 5b illustrate a method of partially removing EMI shielding layer 160 using a dual laser setup. In FIG. 5a, SiP devices 156 are disposed on a carrier 190 after shielding layer 160 is formed in FIG. 2h. Carrier 190 is similar to the carrier that panel 100 is disposed on for singulation and plating of shielding layer 160. However, SiP devices 156 are disposed on a separate carrier to allow the devices to be more spread out.

In FIG. 5b, a dual laser system is used to partially remove EMI shield 160 over open side 156a. Laser 200 emits a beam through scanner 202, and laser 204 emits a beam through scanner 206. The lasers are oriented on opposite sides of a SiP device 156 from each other. Laser 200 is able to hit the surface of SiP device 156 facing toward the viewer of FIG. 5b, and laser 204 is able to hit the surface of the SiP device facing away from the viewer. Both lasers 200 and 204 are able to hit the surfaces of SiP device 156 oriented to the right and the top in FIG. 5b. Lasers 200 and 204 can operate simultaneously to increase throughput.

In combination, lasers 200 and 204 are able to hit all portions of shielding layer 160 on open side 156a. Scanners 202 and 206 sweep across the surfaces of SiP devices 156 in any suitable pattern to remove shielding layer 160 over open side 156a by laser ablation. Each laser removes approximately half of the total removed area of shielding layer 160. After all desired areas of shielding layer 160 have been removed by ablation for a given SiP device 156, carrier 190 is moved so that a different SiP device is disposed between lasers 200 and 204. The completed devices look substantially the same as SiP devices 156 in FIGS. 4a and 4b.

Figure 6B:
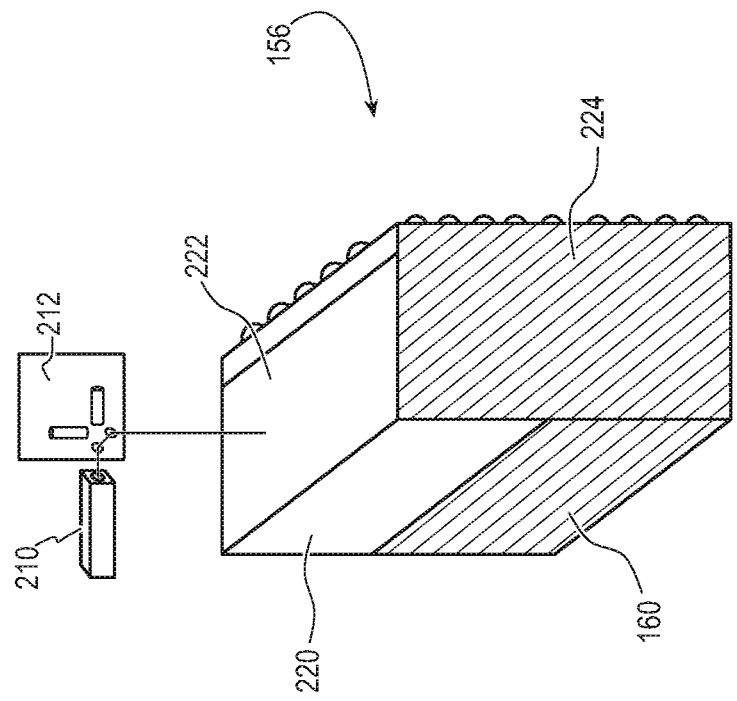
FIGS. 6a-6d illustrate a process of partially removing the EMI shielding from a single freely rotating SiP device using a single laser.
Figure 6A:
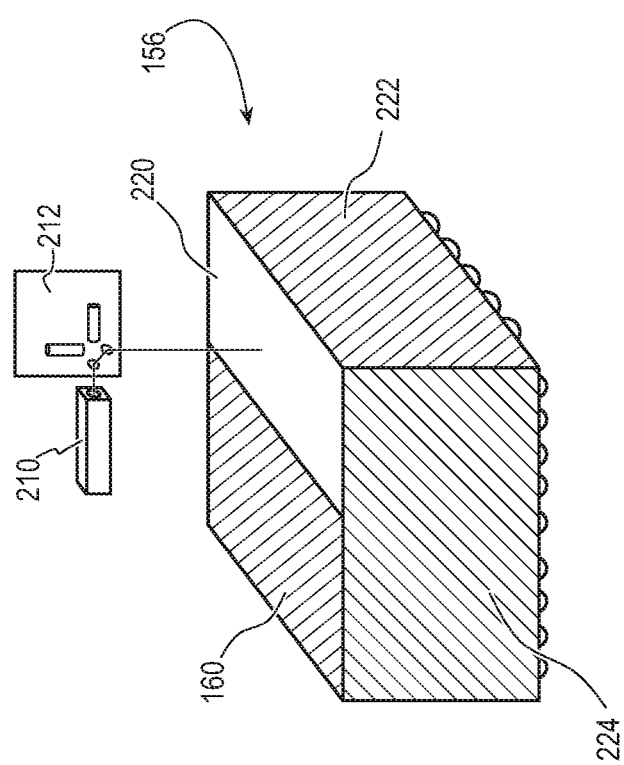

FIGS. 6a-6d illustrate a method of removing EMI shielding layer 160 over open side 156a using one laser operating on a single package at a time. For ablation, SiP devices 156 are picked up one at a time by a pick and place machine, or another tool capable of freely rotating the SiP devices around any and all axes. In FIG. 6a, SiP module 156 is held under laser 210 and scanner 212 with top surface 220 oriented toward the laser. Scanner 212 moves the laser beam around to fully ablate shielding layer 160 from the portion of top surface 220 over open side 156a. A combination of metal peeling and soft laser ablation is used in some embodiments. Top surface 220 of an entire panel of units can be ablated prior to the units being picked up by the pick and place machine, just as in FIG. 3b.

In FIG. 6b, the pick and place machine turns package 156 to orient side surface 222 toward laser 210. Scanner 212 guides the beam from laser 210 to cover surface 222 and fully remove shielding layer 160 from the surface. Surface 222 is oriented parallel to the plane of lid 150, so fully removing shielding layer 160 from surface 222 does not expose lid 150. In other embodiments, a portion of shielding layer 160 is left on surface 222.

In FIG. 6c, SiP device 156 is again turned by the pick and place machine, now with side surface 224 oriented toward laser 210. The beam of laser 210 is scanned across the portion of surface 224 over open side 156a to remove shielding layer 160 by ablation. Shielding layer 160 is removed up to the edge of open side 156a, where the shielding layer contacts lid 150. Shielding layer 160 remains fully contacting lid 150 to improve EMI blocking. In other embodiments, lid 150 is fully or partially exposed.

Figure 6D:
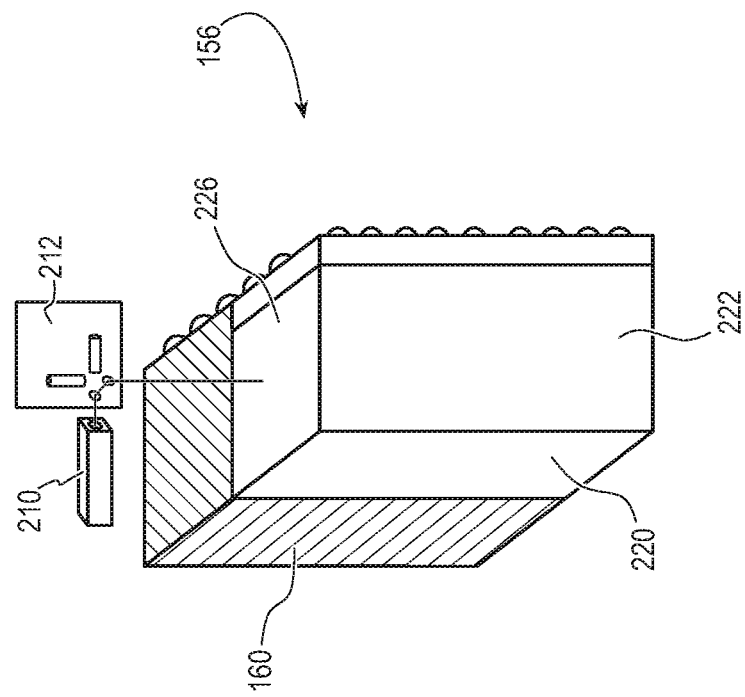
Figure 6C:
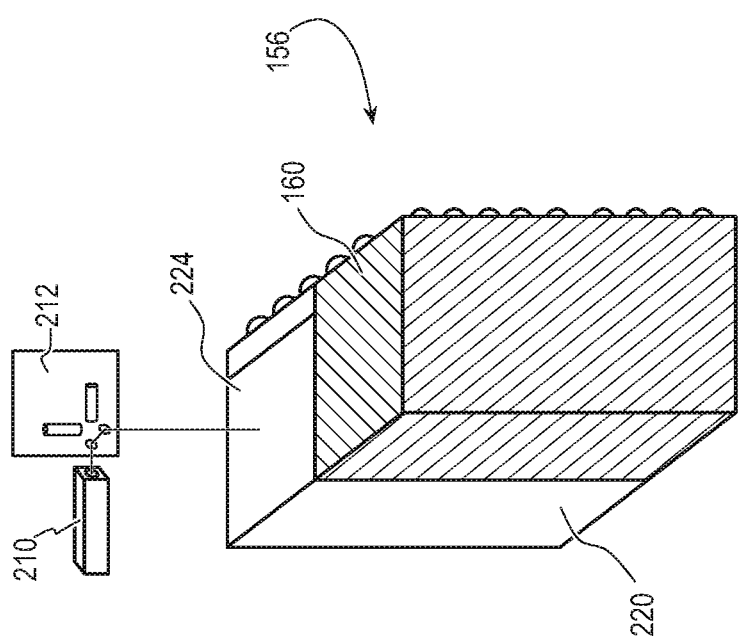

Finally, in FIG. 6d, SiP device 156 is turned with side surface 226 oriented toward laser 210. Shielding layer 160 is removed from surface 226 over open side 156a. All of the side surfaces 222-226 can have shielding layer 160 removed by a combination of metal peeling and soft laser ablation, or by a single ablation step. With surfaces 220-226 of SiP device 156 all ablated over open side 156a, SiP device 156 appears similarly to in FIGS. 4a and 4b. While surfaces 220-226 are illustrated as being ablated in one specific order, SiP device 156 is rotated in any suitable pattern to ablate the surfaces in any desired order.

Figure 7:
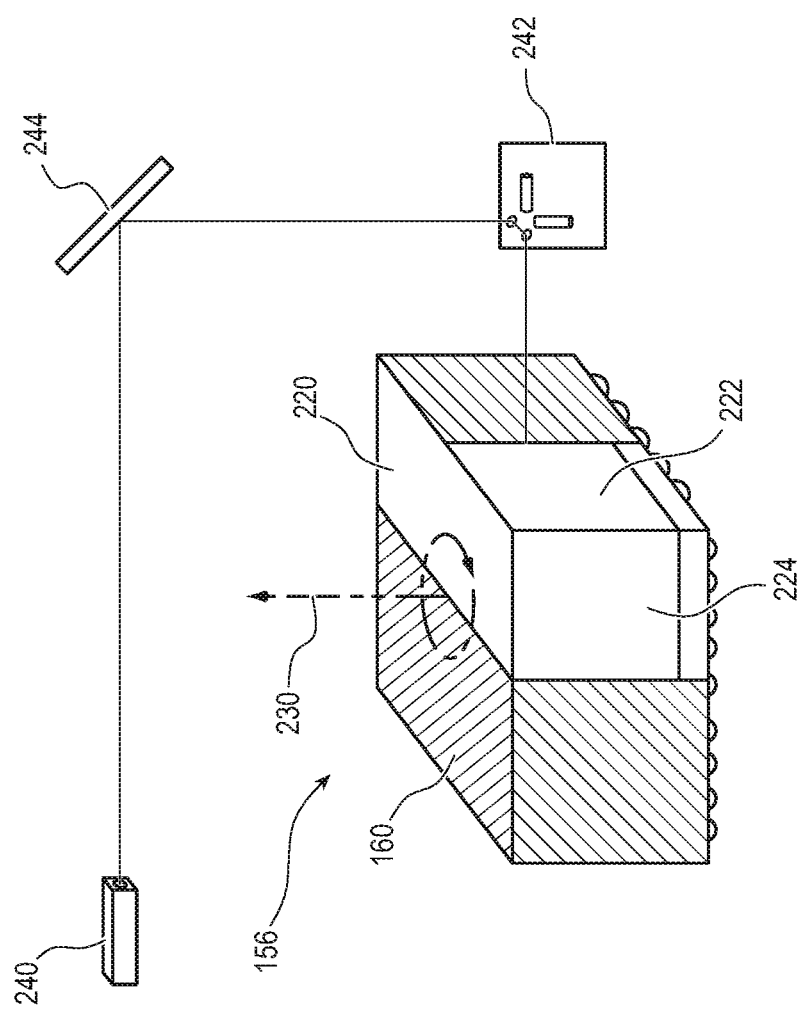
FIG. 7 illustrates a process of partially removing the EMI shielding from a single unit rotating about only one axis.

FIG. 7 shows a method of laser ablation that uses a single laser operating on a single SiP device 156. In FIG. 7, a method of holding SiP device 156 is used that only allows rotation of the device around a single axis 230 oriented vertically. First, shielding layer 160 is removed from top surface 220 using ablation by laser 240 and a scanner, similar to the step shown in FIG. 6a. After top surface 220 is ablated, the scanner is actuated out of the path of the laser beam, and the beam from laser 240 is reflected to scanner 242 by mirror 244. Scanner 242 is disposed to the side of SiP device 156 to allow the scanner to guide the beam from laser 240 to side surfaces of the SiP device.

In FIG. 7, ablation began with surface 224 oriented toward scanner 242. Shielding layer 160 was removed from surface 224, and then SiP device 156 was rotated about axis 230 so that surface 222 is oriented toward the scanner. Scanner 242 scans the beam from laser 240 to remove shielding layer 160 from surface 222. In the illustrated embodiment, scanner 242 uses an S pattern with vertical sweeps going from left to right. The laser is about halfway completed with ablation of surface 222. Once ablation of shielding layer 160 is complete on surface 222, SiP device 156 will be rotated about axis 230 again to perform ablation on surface 226. In some embodiments, scanner 242 is used to scan the laser beam in the vertical direction only, and scanning in the horizontal direction is performed by rotating SiP module 156 about axis 230. Once ablation is complete on all desired surfaces, SiP module 156 appears substantially the same as in FIGS. 4a and 4b.

FIGS. 8a-8f illustrate a method of combining a film mask with laser ablation to remove shielding layer 160 over open side 156a. Using a film mask to perform partial shielding layer removal is explained more thoroughly in U.S. patent application Ser. No. 16/116,485, filed Aug. 29, 2018, which is incorporated herein by reference. FIGS. 8a and 8b show a cross-section and perspective view, respectively, of panel 100 with film 252 disposed over open side 156a of each SiP device 156. Film 252 is an adhesive tape, metal foil film, metal foil tape, polyimide film, or any other suitable film mask. A metal, plastic, or silicone mask is used for film 252 in other embodiments.

Any of the film 252 options can include adhesive to provide a mechanical attachment of the film to encapsulant 130. The adhesive can be ultraviolet (UV) release, thermal release, or otherwise configured to allow for convenient removal of film 252. Film 252 can also be any suitable insulating, passivation, or photoresist layer deposited by any appropriate thin film deposition technique. Film 252 is applied over the top surface of panel 100 on encapsulant 130 and runs in parallel with lids 150. Lids 150 remain exposed from film 252 so that shielding layer 160 will contact the lids to form a continuous EMI shield.

Film 252 is applied in strips over open side 156a prior to singulation of panel 100 into individual units. In other embodiments, film 252 is applied after singulation. Film 252 extends along the entire length of panel 100 in parallel with lid 150, and perpendicularly across panel 100 from each lid to an adjacent saw street 102. Therefore, the open side 156a of each SiP device 156 is fully covered by film 252. In other embodiments, only a portion of each open side 156a is covered by film 252. Film 252 could be applied as a small patch of film directly over each semiconductor die 124 without extending to lid 150 or any saw street 102.

Figure 2H:
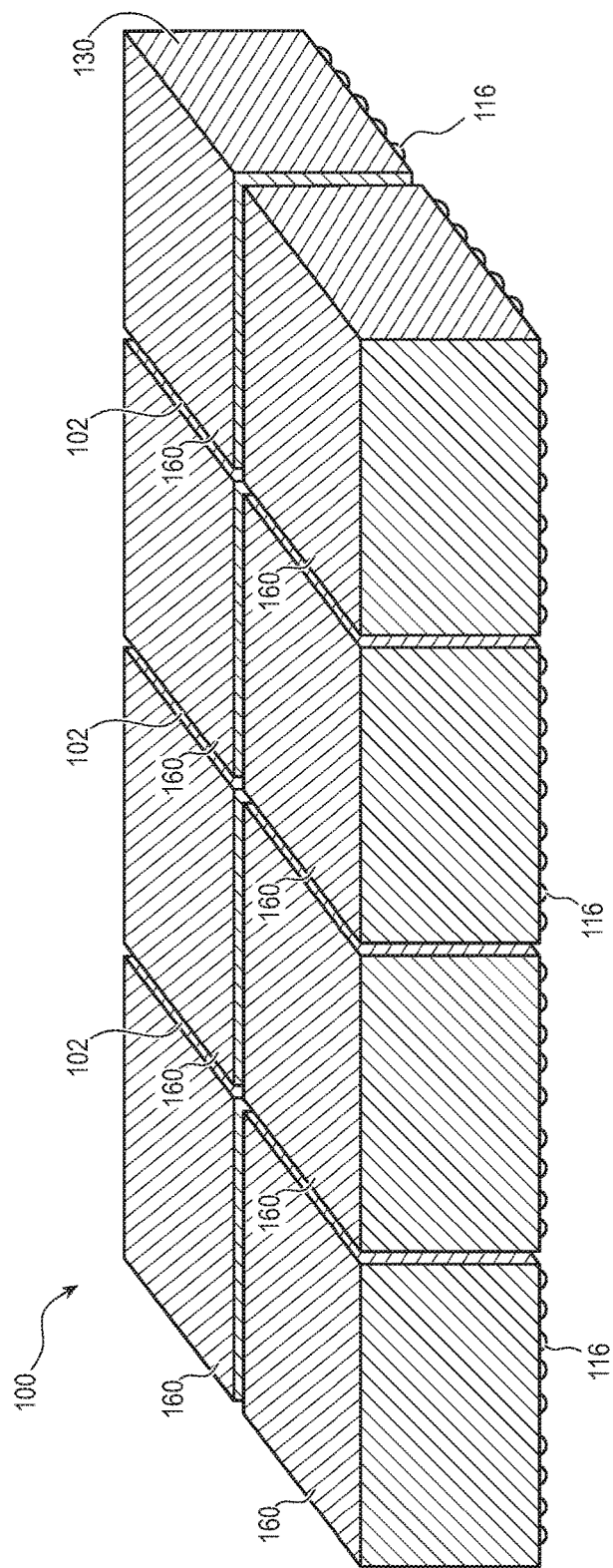

In FIGS. 8c and 8d, shielding layer 160 is deposited in substantially the same manner as in FIG. 2h. The entirety of SiP devices 156, including film 252, is covered in shielding layer 160. In FIGS. 8e and 8f, shielding layer 160 is removed from the top surface of open side 156a by removing film 252 rather than with laser peeling or laser ablation as in the above embodiments. Mechanical peeling of film 252 also removes the portion of shielding layer 160 on top of the film, thus creating an opening in the shielding layer over open side 156a. Shielding layer 160 is then removed over side surfaces of SiP device 156 using any of the above laser ablation methods.

FIGS. 9a-9c show three non-limiting configurations for removal of shielding layer 160. While the above embodiments all show shielding layer 160 completely removed over all surfaces of open side 156a, some embodiments will benefit from having the shielding layer only partially removed. Leaving a portion of shielding layer 160 over open side 156a can help guide broadcasts from the open side, and help reduce EMI in open side 156a coming from certain directions.

In FIG. 9a, shielding layer 160 is removed only from the center of top surface 220 and side surface 222, but not the ends of those surfaces. In addition, shielding layer 160 is not removed from side surfaces 224 and 226. The portions of shielding layer 160 remaining at the ends of open side 156a protect the open side from EMI while still allowing intentionally transmitted signals through.

FIG. 9b shows shielding layer 160 remaining on only the middle portion of surfaces 220 and 222, while being removed at the ends and on surfaces 224 and 226. FIG. 9c shows shielding layer 160 removed at only one end of open side 156a. Shielding layer 160 can be removed from over open side 156a in any desired pattern.

Figure 10A:
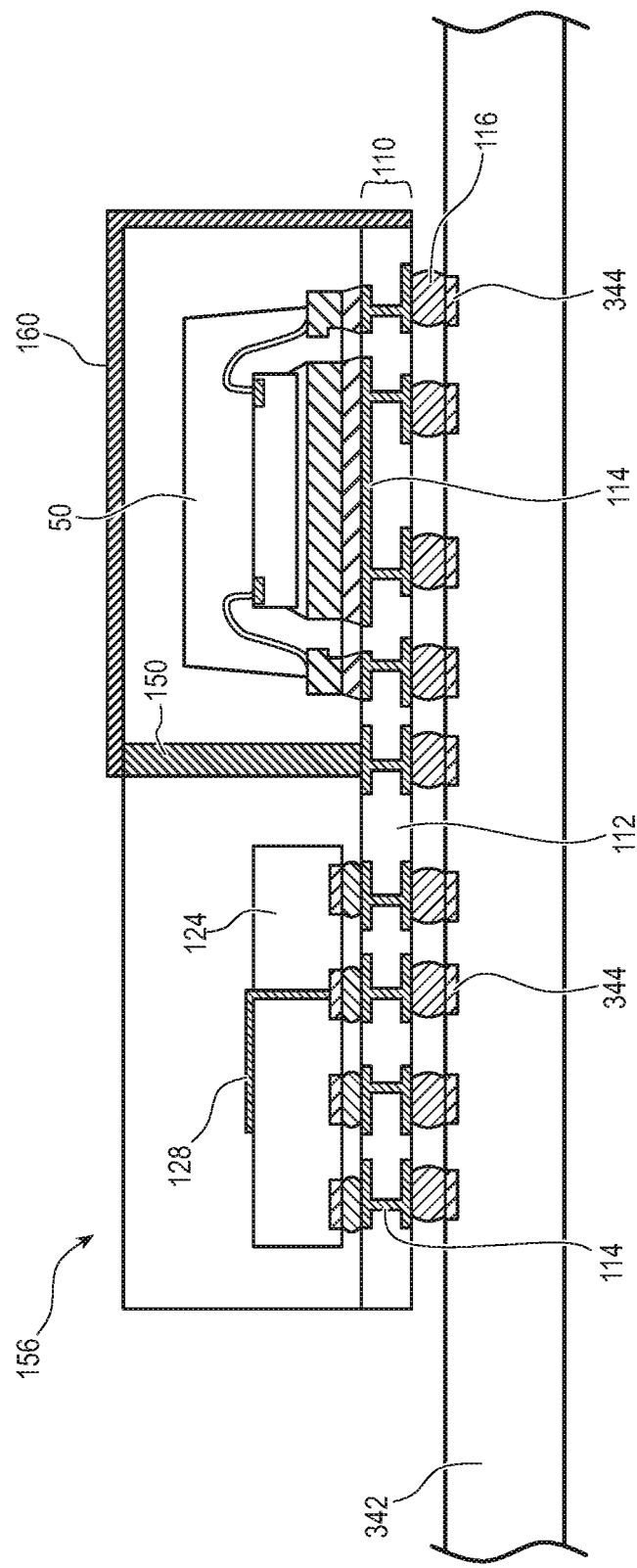
FIGS. 10a and 10b illustrate integrating a SiP device into an electronic device.
Figure 10B:
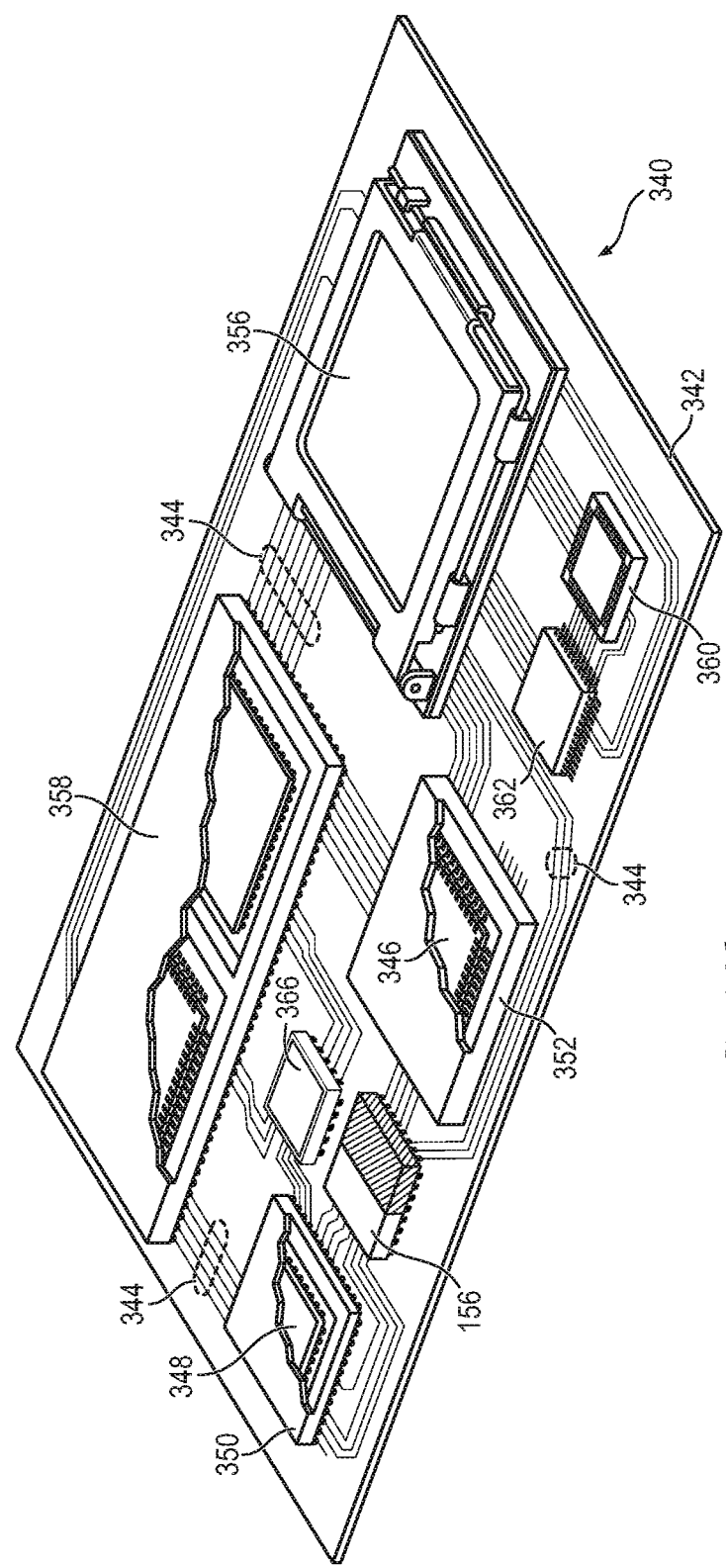

FIGS. 10a and 10b illustrate incorporating SiP device 156 into an electronic device after forming a partial shielding layer by any of the above described processes. FIG. 10a illustrates a partial cross-section of SiP device 156 from FIGS. 4a and 4b mounted onto a PCB or other substrate 342 as part of an electronic device. Bumps 116 are reflowed onto conductive layer 344 of PCB 342 to physically attach and electrically connect SiP device 156 to the PCB. In other embodiments, thermocompression or other suitable attachment and connection methods are used. Rather than bumps, interconnect can be provided through stud bumps, lands, pins, bond wires, or any other suitable interconnect structure. In some embodiments, an adhesive or underfill layer is used between SiP device 156 and PCB 342. Semiconductor die 124 and package 50 are electrically coupled to conductive layer 344 and each other through conductive layer 114 and bumps 116.

FIG. 10b illustrates electronic device 340 including PCB 342 with a plurality of semiconductor packages mounted on a surface of the PCB, including SiP device 156. Electronic device 340 can have one type of semiconductor package, or multiple types of semiconductor packages, depending on the application.

Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or other signal processing card that is inserted into a computer. The semiconductor packages can include microprocessors, memories, ASICs, logic circuits, analog circuits, RF circuits, discrete active or passive devices, or other semiconductor die or electrical components.

In FIG. 10b, PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, LGA 356, multi-chip module (MCM) 358, quad flat non-leaded package (QFN) 360, and wafer level chip scale package (WLCSP) 366 are shown mounted on PCB 342 along with SiP device 156. Conductive traces 344 electrically couple the various packages and components disposed on PCB 342 to SiP device 156, giving use of the components within the SiP device to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a semiconductor package comprising an encapsulant and an electromagnetic interference (EMI) shield exposed from the encapsulant;

forming a conductive layer over the encapsulant and in contact with the EMI shield; and removing a first portion of the conductive layer, wherein the first portion of the conductive layer extends over a plurality of surfaces of the semiconductor package.

2. The method of claim 1, further including removing the first portion of the conductive layer using a plurality of laser ablation processes.

3. The method of claim 1, wherein removing the first portion of the conductive layer includes a metal peeling process.

4. The method of claim 1, wherein the plurality of laser ablation processes occurs simultaneously.

5. The method of claim 1, further including rotating the semiconductor package while removing the first portion of the conductive layer.

6. The method of claim 1, further including removing a second portion of the conductive layer discontinuous with the first portion of the conductive layer.

7. A method of making a semiconductor device, comprising:
providing a semiconductor package including a conductive layer formed over the semiconductor package; and
removing a first portion of the conductive layer, wherein the first portion of the conductive layer extends over a plurality of surfaces of the semiconductor package, wherein removing the first portion of the conductive layer includes a metal peeling process.

8. The method of claim 7, further including removing the first portion of the conductive layer using a plurality of laser ablation processes.

9. The method of claim 8, wherein the plurality of laser ablation processes occurs simultaneously.

10. The method of claim 7, further including rotating the semiconductor package while removing the first portion of the conductive layer.

11. The method of claim 7, further including removing a second portion of the conductive layer discontinuous with the first portion of the conductive layer.

12. The method of claim 7, wherein the semiconductor package includes an electromagnetic interference (EMI) shield in contact with the conductive layer.

13. A method of making a semiconductor device, comprising:
providing a semiconductor package comprising a conductive layer formed over the semiconductor package;
removing a first portion of the conductive layer using laser ablation; and
removing a second portion of the conductive layer using laser ablation.

14. The method of claim 13, wherein the first portion of the conductive layer is removed over a first surface of the semiconductor package and the second portion of the conductive layer is removed over a second surface of the semiconductor package different from the first surface.

15. The method of claim 14, wherein the first portion of the conductive layer and second portion of the conductive layer are each removed using a laser oriented perpendicular to the first surface and parallel to the second surface.

16. The method of claim 13, further including removing the first portion of the conductive layer simultaneously with removing the second portion of the conductive layer.

17. The method of claim 13, further including rotating the semiconductor package after removing the first portion of the conductive layer and before removing the second portion of the conductive layer.

18. The method of claim 13, wherein the first portion of the conductive layer and second portion of the conductive layer are continuous with each other.

19. A method of making a semiconductor device, comprising:
providing a semiconductor package including a conductive layer over the semiconductor package;
removing a first portion of the conductive layer over a first surface of the semiconductor package; and
removing a second portion of the conductive layer over a second surface of the semiconductor package different from the first surface.

20. The method of claim 19, wherein the first portion of the conductive layer and second portion of the conductive layer are each removed using a laser oriented perpendicular to the first surface and parallel to the second surface.

21. The method of claim 19, further including removing the first portion of the conductive layer simultaneously with removing the second portion of the conductive layer.

22. The method of claim 19, further including rotating the semiconductor package after removing the first portion of the conductive layer and before removing the second portion of the conductive layer.

23. The method of claim 19, wherein the first portion of the conductive layer and second portion of the conductive layer are discontinuous.

* * * * *